(12) United States Patent
Miyachi

(10) Patent No.: US 12,334,418 B2
(45) Date of Patent: Jun. 17, 2025

(54) SEMICONDUCTOR MODULE WITH IMPROVED INSPECTABILITY OF STACKED SEMICONDUCTOR ELEMENTS

(71) Applicant: DENSO CORPORATION, Kariya (JP)

(72) Inventor: Syuhei Miyachi, Kariya (JP)

(73) Assignee: DENSO CORPORATION, Kariya (JP)

( * ) Notice: Subject to any disclaimer, the term of this patent is extended or adjusted under 35 U.S.C. 154(b) by 517 days.

(21) Appl. No.: 17/657,287

(22) Filed: Mar. 30, 2022

(65) Prior Publication Data

US 2022/0223502 A1 Jul. 14, 2022

Related U.S. Application Data

(63) Continuation of application No. PCT/JP2020/037025, filed on Sep. 29, 2020.

(30) Foreign Application Priority Data

Oct. 2, 2019 (JP) ................. 2019-182499

(51) Int. Cl.
*H01L 23/495* (2006.01)
*H01L 23/00* (2006.01)
*H01L 23/29* (2006.01)
*H01L 25/07* (2006.01)

(52) U.S. Cl.
CPC ...... *H01L 23/49541* (2013.01); *H01L 23/293* (2013.01); *H01L 24/32* (2013.01); *H01L 24/40* (2013.01); *H01L 25/074* (2013.01); *H01L 2224/32245* (2013.01); *H01L 2224/40245* (2013.01); *H01L 2924/13055* (2013.01); *H01L 2924/13091* (2013.01)

(58) Field of Classification Search
CPC .................................. H01L 23/49562
USPC ............................................. 257/53
See application file for complete search history.

(56) References Cited

U.S. PATENT DOCUMENTS

| | | | |
|---|---|---|---|
| 2005/0224945 A1* | 10/2005 | Saito | H01L 24/37 257/E23.052 |
| 2007/0158682 A1 | 7/2007 | Terao | |
| 2010/0025839 A1 | 2/2010 | Nishikawa | |
| 2012/0175760 A1* | 7/2012 | Nishikawa | H01L 22/12 257/676 |
| 2015/0200154 A1* | 7/2015 | Choi | H01L 23/481 257/777 |
| 2017/0040246 A1* | 2/2017 | Shuto | H01L 25/0657 |
| 2018/0204790 A1 | 7/2018 | Shuto et al. | |
| 2019/0333909 A1 | 10/2019 | Sugita et al. | |

FOREIGN PATENT DOCUMENTS

| | | | |
|---|---|---|---|
| JP | 2005277014 A | * | 10/2005 |
| JP | 2014-130894 A | | 7/2014 |

* cited by examiner

*Primary Examiner* — Ajay Arora
(74) *Attorney, Agent, or Firm* — Maschoff Brennan

(57) ABSTRACT

A semiconductor module includes: two semiconductor elements stacked in a vertical direction to overlap at least a part of the semiconductor elements; a conductive member stacked on the semiconductor elements and electrically connected to at least one of the semiconductor elements; and a resin mold integrally sealing the semiconductor elements and the conductive member. A lower semiconductor element has at least observable positions of both ends of two sides substantially orthogonal to each other when viewed from above in the vertical direction without arranging the resin mold.

9 Claims, 9 Drawing Sheets

SEMICONDUCTOR MODULE WITH IMPROVED INSPECTABILITY OF STACKED SEMICONDUCTOR ELEMENTS

CROSS REFERENCE TO RELATED APPLICATION

The present application is a continuation application of International Patent Application No. PCT/JP2020/037025 filed on Sep. 29, 2020, which designated the U.S. and claims the benefit of priority from Japanese Patent Application No. 2019-182499 filed on Oct. 2, 2019. The entire disclosures of all of the above applications are incorporated herein by reference.

TECHNICAL FIELD

The present disclosure relates to a semiconductor module including a plurality of semiconductor elements.

BACKGROUND

A conceivable technique teaches a semiconductor module in which two semiconductor elements having a substantially rectangular shape when viewed from above are stacked in the vertical direction and integrally housed in a resin mold. The two semiconductor elements have substantially rectangular shape with long sides in the same direction, and are arranged at positions shifted from each other along the long side direction.

SUMMARY

According to an example, a semiconductor module includes: two semiconductor elements stacked in a vertical direction to overlap at least a part of the semiconductor elements; a conductive member stacked on the semiconductor elements and electrically connected to at least one of the semiconductor elements; and a resin mold integrally sealing the semiconductor elements and the conductive member. A lower semiconductor element has at least observable positions of both ends of two sides substantially orthogonal to each other when viewed from above in the vertical direction without arranging the resin mold.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
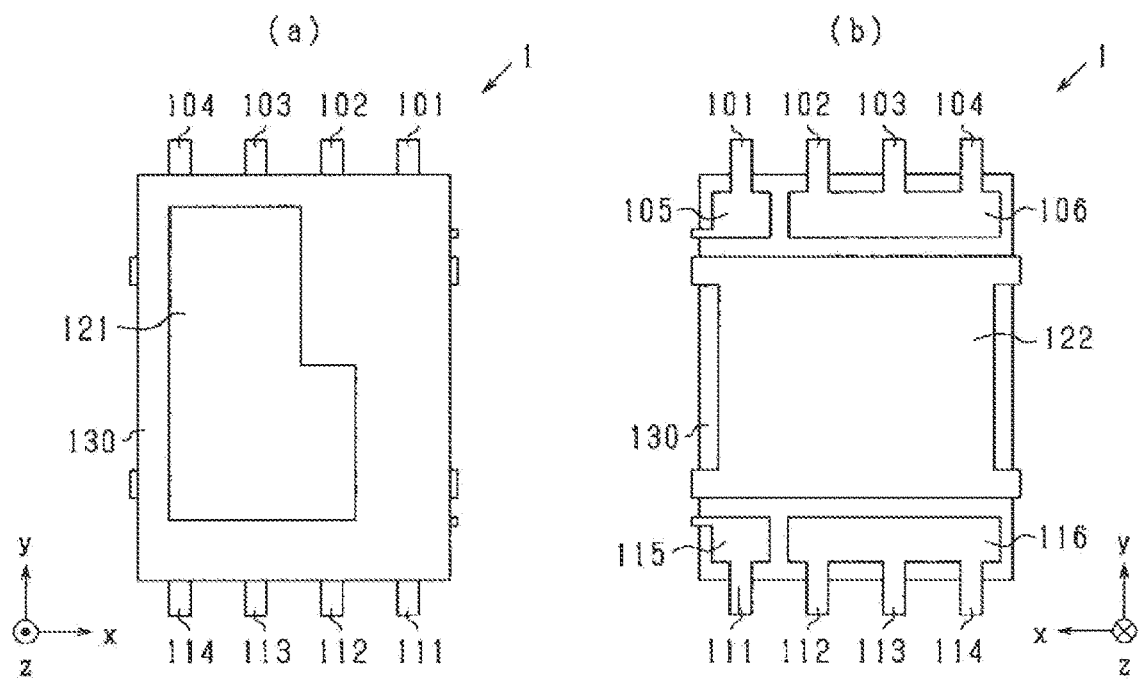
FIG. 1 is a plan view showing a semiconductor module according to a first embodiment.

In a conceivable technique, when viewed from above, the upper surface of the semiconductor element arranged below is covered more than half thereof by the semiconductor element arranged above. Therefore, after mounting the two semiconductor elements, it may be difficult to observe the position of the lower semiconductor element, and the positional deviation may not be detected.

A technique is provided for easily detecting a displacement of a semiconductor element in a semiconductor module including two mounted semiconductor elements.

In the present embodiments, a semiconductor module includes: two semiconductor elements having a shape which is a substantially rectangular when viewed from above and stacked in an up-down direction so that at least a part thereof overlaps; a conductive member mounted on an upper surface side or a lower surface side of the two semiconductor elements and electrically connected to the semiconductor element; and a resin mold for integrally sealing the two semiconductor elements and the conductive member. In this semiconductor module, the lower semiconductor element arranged below the two semiconductor elements is arranged so as to observe at least both ends of two sides thereof substantially orthogonal to the substantially rectangular shape when the semiconductor module is viewed from above in a condition that the resin mold is not arranged.

According to the present embodiments, the two semiconductor elements whose shape is a substantially rectangular when viewed from above are arranged and stacked so as to observe positions of both ends of two sides thereof substantially orthogonal to the substantially rectangular shape of the lower semiconductor element disposed on a lower side when the semiconductor module is viewed from above in a condition that the resin mold is not arranged. By observing the positions of both ends, the position of the lower semiconductor element can be detected, so that the positional deviation between the two stacked semiconductor elements can be easily detected.

First Embodiment

As shown in FIGS. 1 to 4, a semiconductor module 1 according to a first embodiment includes an upper semiconductor element 10 and a lower semiconductor element 20, a resin mold 130 for integrally sealing the upper semiconductor element 10 and the lower semiconductor element 20, and external terminals 101 to 104, 111 to 114. An x-axis direction and a y-axis direction shown in FIGS. 1 to 4 are sides of the semiconductor module 1, and an xy-plane direction is a plane direction of the semiconductor module 1. The z-axis direction is a vertical direction orthogonal to the plane direction.

Figure 2:
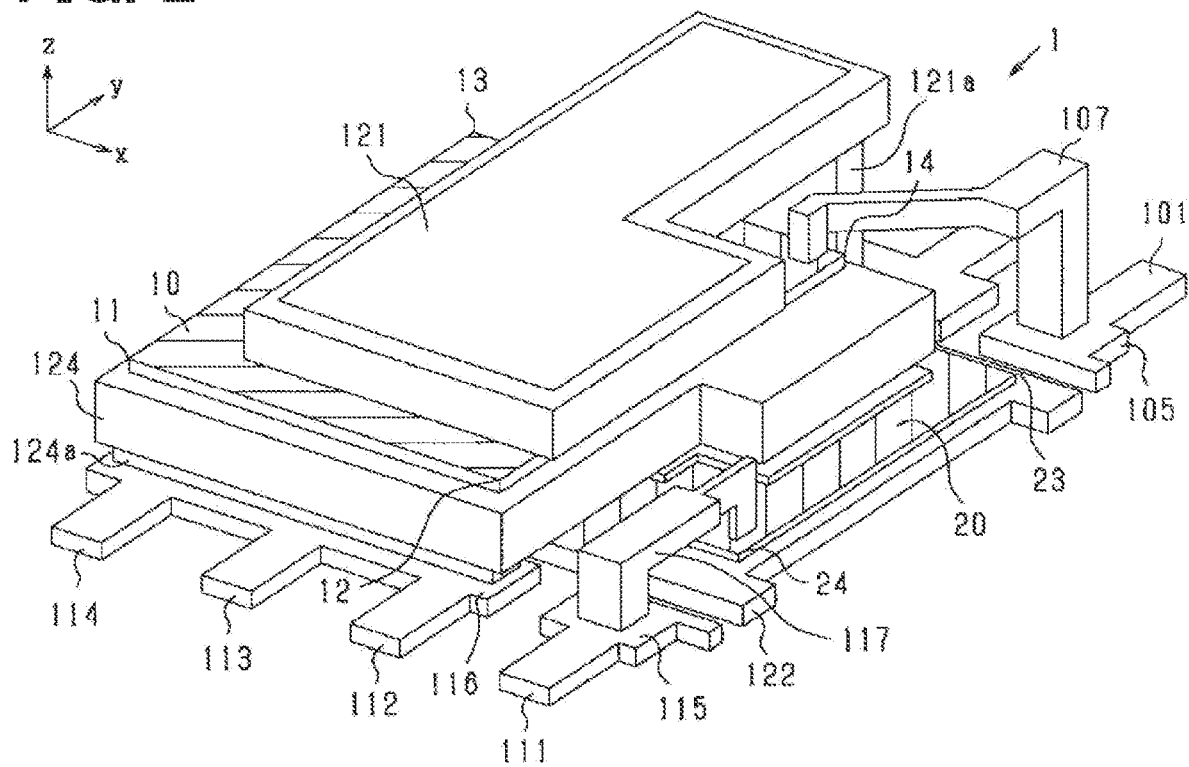
FIG. 2 is a perspective view showing a state in which the resin mold is not arranged in the semiconductor module shown in FIG. 1.
Figure 3:
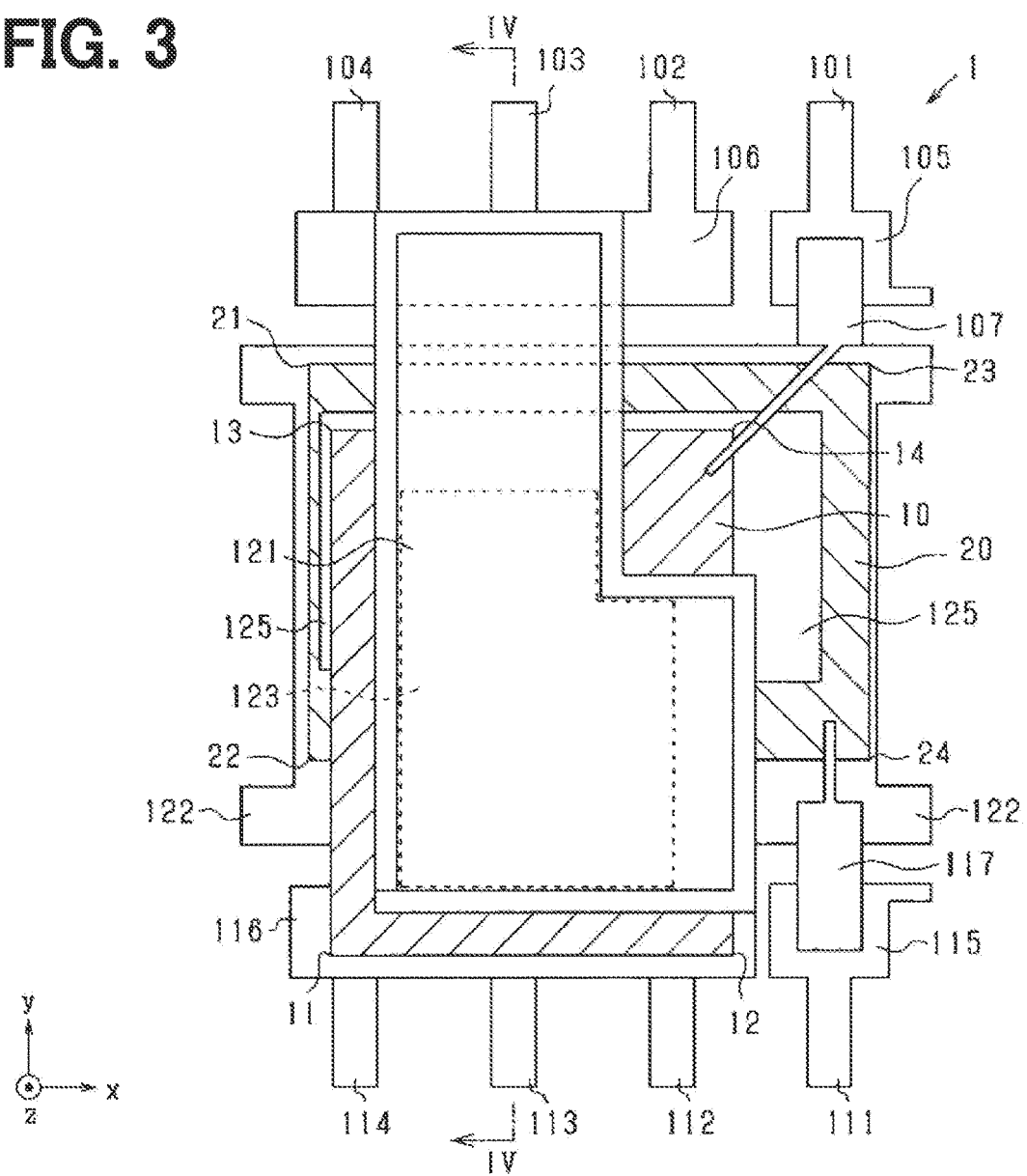
FIG. 3 is a plan view showing a state in which the resin mold is not arranged in the semiconductor module shown in FIG. 1.
Figure 4:
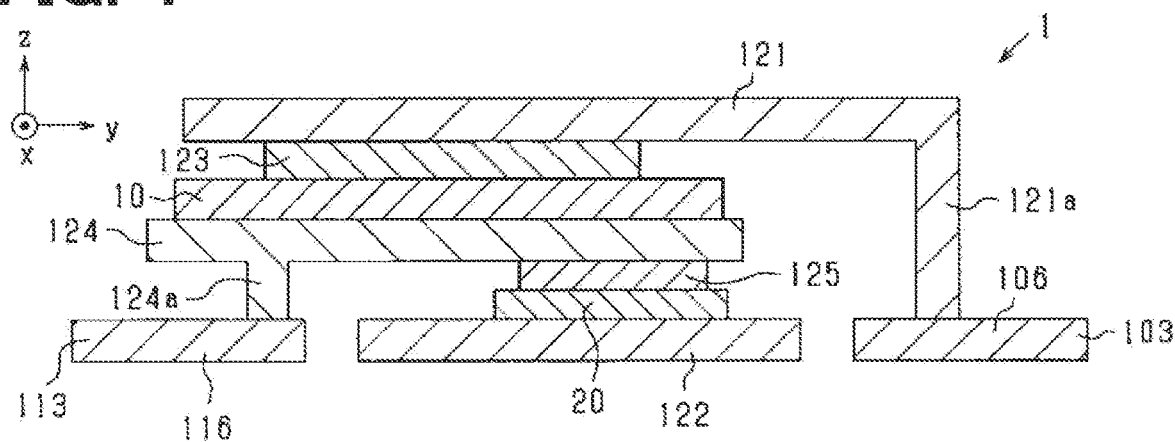
FIG. 4 is a cross-sectional view taken along line IV-IV of FIG. 3.

As shown in FIG. 1, the semiconductor module 1 has an appearance in which eight external terminals 101 to 104 and 111 to 114 protrude in the y-axis direction from the resin mold 130 having a substantially rectangular shape when viewed from the top. The external terminals 101 to 104 are placed in a stated order from a positive direction to a negative direction of the x-axis in a positive direction (i.e., the first direction) of the y-axis, which is the side of the resin mold 130, and extend in the y-axis direction as a longitudinal direction. The external terminals 111 to 114 are placed in a stated order from a positive direction to a negative direction of the x-axis in a negative direction of the y-axis, which is a second direction opposed to the first direction across the resin mold 130, and extend in the y-axis direction as the longitudinal direction As shown in FIGS. 2 to 4, the upper semiconductor element 10 and the lower semiconductor element 20 are integrally sealed in the resin mold 130 in a state of being stacked on each other in the z-axis direction. The upper semiconductor element 10 and the lower semiconductor element 20 are semiconductor elements having the same structure, shape, size, and the like, and have a substantially rectangular shape when viewed from the top. When the upper semiconductor element 10 and the lower semiconductor element 20 are vertically stacked in the same direction without being displaced from each other in the plane direction, the corner 11 and the corner 21, the corner 12 and the corner 22, the corner 13 and the corner 23, and the corner 14 and the corner 24 are approximately the same position in the plane direction.

Figure 5:
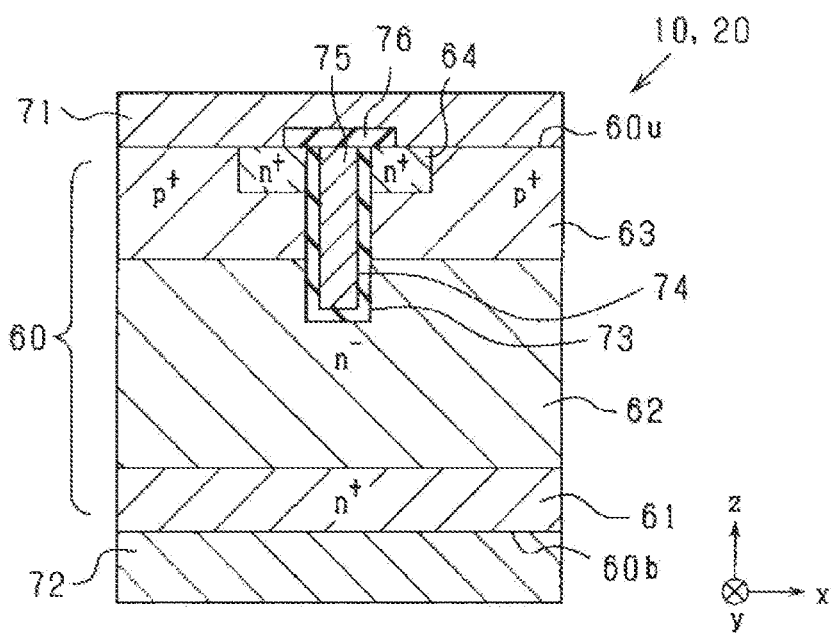
FIG. 5 is a cross-sectional view showing an element structure of a semiconductor element in the semiconductor module shown in FIG. 1.

The upper semiconductor element 10 and the lower semiconductor element 20 are vertical insulated gate semiconductor elements having an element structure as shown in FIG. 5. More specifically, the upper semiconductor element 10 and the lower semiconductor element 20 are power MOSFETs (Metal-Oxide-Semiconductor Field-Effect Transistors: MOSFETs).

The upper semiconductor element 10 and the lower semiconductor element 20 each include a semiconductor substrate 60, a source electrode 71, and a drain electrode 72. The source electrode 71 is formed in contact with an upper surface 60u of the semiconductor substrate 60. The drain electrode 72 is formed in contact with a lower surface 60b of the semiconductor substrate 60. The upper surface 60u corresponds to the first surface, and the lower surface 60b corresponds to the second surface. In the semiconductor substrate 60, an n+ region 61, an n− region 62, and a p+ region 63 are stacked on each other in this order from the lower surface 60b side. An n+ region 64 is formed in a part of the p+ region 63 on the upper surface side. A trench 73 is provided to penetrate from the upper surface 60u of the semiconductor substrate 60 through the n+ region 64 and the p+ region 63, and reaches an upper surface side of the n− region 62. A gate insulation film 74 is formed on an inner wall surface of the trench 73, and a gate electrode 75 is filled in the trench 73 in a state of being insulated from the semiconductor substrate 60 by the gate insulation film 74. An upper surface of the gate electrode 75 is covered with an insulation film 76, and the gate electrode 75 and the source electrode 71 are insulated from each other by the insulation film 76. A material of the semiconductor substrate 60 is not particularly limited, silicon (Si), silicon carbide (SiC), gallium nitride (GaN), or the like may be exemplified.

When a positive voltage is applied to the gate electrode 75 of each of the upper semiconductor element 10 and the lower semiconductor element 20, an n-type channel is provided in the p+ region 63 along the gate insulation film 74, and n-type carriers move from the source electrode 71 to the drain electrode 72 in the semiconductor substrate 60. As a result, a current flows from the drain electrode 72 to the source electrode 71. In other words, in the upper semiconductor element 10 and the lower semiconductor element 20, a gate voltage applied to the gate electrode 75 is controlled, thereby being capable of performing on/off control of switching elements of the upper semiconductor element 10 and the lower semiconductor element 20. The source electrode 71 corresponds to a first electrode, and the source terminal electrically connected to the source electrode 71 among the external terminals corresponds to a first terminal. The drain electrode 72 corresponds to a second electrode, and a drain terminal electrically connected to the drain electrode 72 among the external terminals corresponds to a second terminal.

The upper semiconductor element 10 and the lower semiconductor element 20 are stacked with the source electrodes 71 facing upward (positive direction in the z-axis) and the drain electrodes facing downward (negative direction in the z-axis), and the upper semiconductor element 10 is placed on an upper side and the lower semiconductor element 20 is placed on a lower side. As shown in FIGS. 2 to 4, the upper semiconductor element 10 is disposed so that a longitudinal direction of the upper semiconductor element 10 is the y-axis direction when viewed from the top, and the lower semiconductor element 20 is disposed so that a longitudinal direction of the lower semiconductor element 20 is the x-axis direction when viewed from the top. In other words, when viewed from the top, the upper semiconductor element 10 is disposed in an orientation of being rotated by substantially 90° counterclockwise about the vertical direction as an axis with respect to the lower semiconductor element 20.

As shown in FIGS. 2 to 4, the semiconductor module 1 includes a first conductive member 121, a second conductive member 123, an upper semiconductor element 10, a third conductive member 124, a fourth conductive member 125, a lower semiconductor element 20, and an electrode pad 122 stacked in a stated order from the top. The semiconductor module 1 further includes conductive bonding plates 105, 106, 115, and 116 at the same position as that of the electrode pads 122 in the vertical direction. The bonding plate 105 is formed integrally with the external terminal 101. The bonding plate 106 is formed integrally with the external terminals 102 to 104. The bonding plate 115 is formed integrally with the external terminal 111. The bonding plate 116 is formed integrally with the external terminals 112 to 114. The external terminals 101 to 104 and 111 to 114, the bonding plates 105, 106, 115, and 116, and the electrode pad 122 are formed in a lead frame. The semiconductor module 1 further includes conductive gate connection members 107 and 117.

The second conductive member 123 corresponds to a source electrode formed on the upper surface side of the upper semiconductor element 10. The second conductive member 123 has a shape in which one of four corners of a rectangular shape is notched when viewed from the top, and a gate pad of the upper semiconductor element 10 is provided in the notched portion. The upper surface of the second conductive member 123 is bonded to the lower surface of the first conductive member 121 through solder. The gate pad of the upper semiconductor element 10 and the gate pad of the lower semiconductor element 20 are provided at positions such that they are substantially the same position when each is viewed from above. More specifically, the gate pad of the upper semiconductor element 10 is provided in the vicinity of the corner 14, and the gate pad of the lower semiconductor element 20 is provided in the vicinity of the corner 24.

The first conductive member 121 has a substantially L-shaped shape when viewed from the top, and extends to a position above the bonding plate 106 in the positive direction of the y-axis. The first conductive member 121 has a connection portion 121a extending downward to a position reaching the bonding plate 106 at a position above the bonding plate 106. A lower surface of the connection portion 121a is bonded to an upper surface of the bonding plate 106 through solder. As a result, the source electrode of the upper semiconductor element 10 is electrically connected to the external terminals 102 to 104.

The lower surface side of the upper semiconductor element 10 is the drain electrode side, and is bonded to an upper surface of the third conductive member 124 through solder. The fourth conductive member 125 corresponds to a source electrode formed on the upper surface side of the lower semiconductor element 20. The fourth conductive member 125 is bonded to the third conductive member 124 through solder.

The third conductive member 124 has a substantially L-shaped shape when viewed from the top, and extends to a position above the bonding plate 116 in the negative direction of the y-axis. The third conductive member 124 has a connection portion 124a extending downward to a position reaching the bonding plate 116 at a position above the bonding plate 116. A lower surface of the connection portion 124a is bonded to an upper surface of the bonding plate 116 through solder. As a result, the drain electrode of the upper semiconductor element 10 and the source electrode of the lower semiconductor element 20 are electrically connected to the external terminals 112 to 114. Although the first conductive member 121 and the third conductive member 124 are so-called clips, wire bonding, a wire ribbon, or the like may be used in addition to the clips.

The second conductive member 123 and the fourth conductive member 125 are source electrodes of the upper semiconductor element 10 and the lower semiconductor element 20, respectively, and have the same shape and size. Similar to a positional relationship between the upper semiconductor element 10 and the lower semiconductor element 20, the second conductive member 123 is disposed in an orientation of being rotated by substantially 90° counterclockwise about the vertical direction as the axis with respect to the fourth conductive member 125. With the above placement, the position of the gate pad of the upper semiconductor element 10 is a position at an corner of the positive direction of the x-axis and the positive direction of the y-axis, whereas the position of the gate pad of the lower semiconductor element 20 is a position at an corner of the positive direction of the x-axis and the negative direction of the y-axis.

The lower surface side of the lower semiconductor element 20 is a drain electrode, and is bonded to the electrode pad 122 through solder. As shown in (b) of FIG. 1, the electrode pad 122 is exposed to a lower surface of the resin mold 130, and is electrically connected to the drain electrode of the lower semiconductor element 20. The drain electrode of the lower semiconductor element 20 is not electrically connected to any of the external terminals 101 to 104 and 111 to 114.

The first conductive member 121, the second conductive member 123, the third conductive member 124, and the fourth conductive member 125 are thicker than the electrode pad 122. Since each conductive member is thick and has a weight corresponding to the thickness, it is possible to suppress the positional deviation of the upper semiconductor element 10 and the lower semiconductor element 20 that are stacked in contact with any of the conductive members. That is, since each conductive member is thicker than the electrode pad 122, it is possible to suppress the positional deviation of each configuration inside the resin mold 130 of the semiconductor module 1.

The gate connection member 107 includes a columnar portion extending in the vertical direction on an upper surface of the bonding plate 105, and a beam portion extending from the columnar portion to the gate pad on the upper surface of the upper semiconductor element 10 in an oblique direction which is a negative direction of the x-axis and the y-axis. A lower surface of the columnar portion is bonded to an upper surface of the bonding plate 105 through solder. The beam portion is electrically connected to the gate electrode in the upper semiconductor element 10 through the gate pad. As a result, the gate electrode of the upper semiconductor element 10 is electrically connected to the external terminal 101.

The gate connection member 117 includes a columnar portion extending in the vertical direction on an upper surface of the bonding plate 115, and a beam portion extending from the columnar portion in the positive direction of the y-axis to the gate pad on the upper surface of the lower semiconductor element 20. The lower surface of the columnar portion is bonded to the upper surface of the bonding plate 115 through solder. The beam portion is electrically connected to the gate electrode in the lower semiconductor element 20 through the gate pad. As a result, the gate electrode of the lower semiconductor element 20 is electrically connected to the external terminal 111. The gate connection members 107 and 117 are so-called gate clips, but wire bonding, wire ribbon, or the like may be used in addition to the clips.

The external terminal 101 is a first gate terminal G1 electrically connected to the gate electrode of the upper semiconductor element 10. The external terminal 111 is a second gate terminal G2 electrically connected to the gate electrode 75 of the lower semiconductor element 20. The external terminals 102 to 104 are a first source terminal S1 electrically connected to the source electrode of the upper semiconductor element 10. The external terminals 112 to 114 are a second source terminal S2 electrically connected to the source electrode of the lower semiconductor element 20 and are also a first drain terminal D1 electrically connected to the drain electrode of the upper semiconductor element 10.

Figure 6:
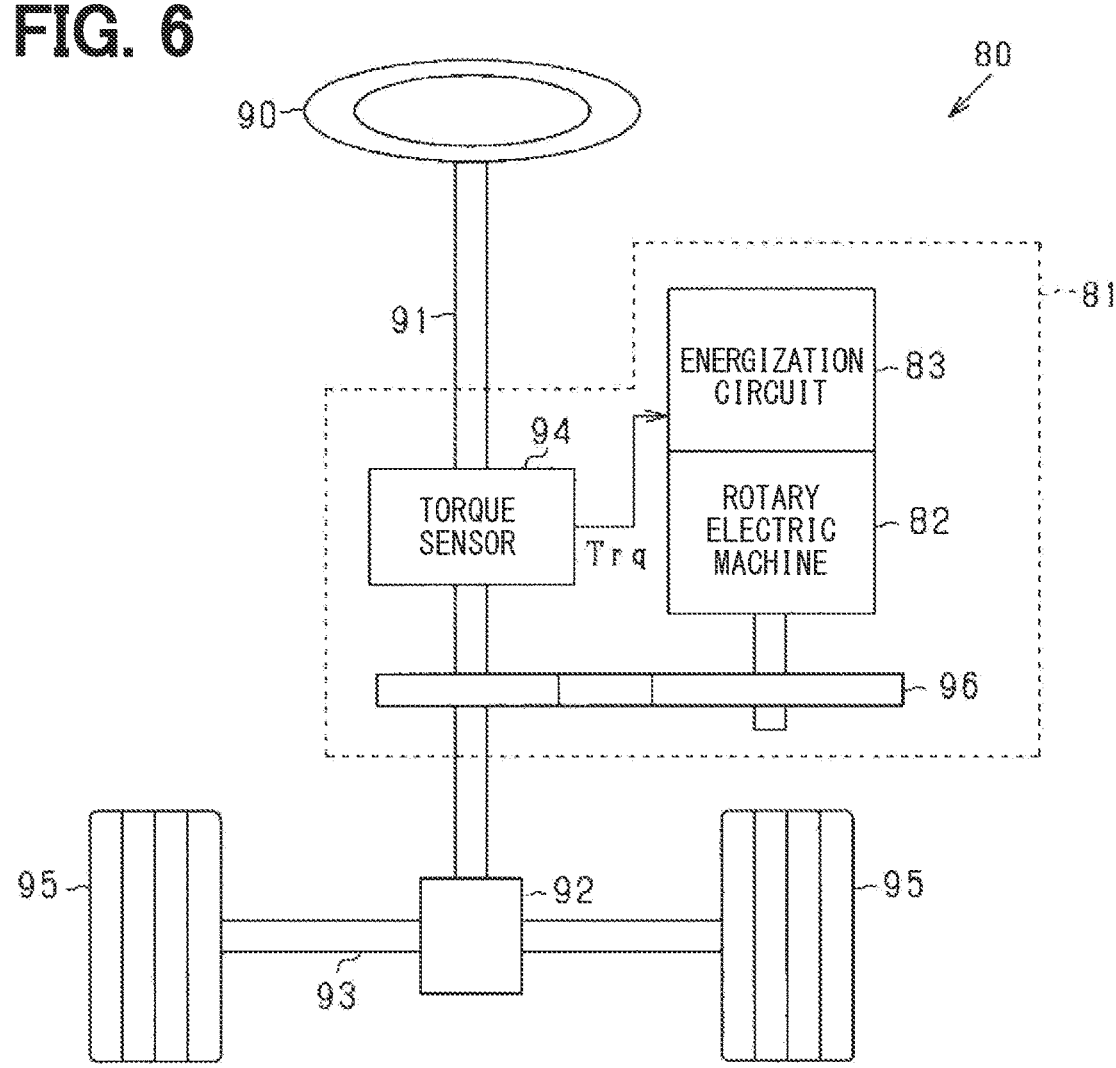
FIG. 6 is a schematic diagram of an electric power steering system to which the semiconductor module according to the first embodiment is applied.

The semiconductor module according to the present embodiment can be applied to a drive circuit of an electric power steering system (EPS) 80 of a vehicle as shown in FIG. 6. The EPS 80 includes a steering wheel 90, a steering shaft 91, a pinion gear 92, a rack shaft 93, and an EPS device 81. The steering shaft 91 is connected to the steering wheel 90. The pinion gear 92 is provided at a tip of the steering shaft 91. The pinion gear 92 is engaged with the rack shaft 93. Wheels 95 are rotatably connected to both ends of the rack shaft 93 through tie rods or the like. When a driver rotates the steering wheel 90, the steering shaft 91 rotates.

The pinion gear 92 converts rotary motion of the steering shaft 91 to linear motion of the rack shaft 93, and the wheels 95 are steered to have a steering angle according to displacement of the rack shaft 93.

The EPS device 81 includes a torque sensor 94, a speed reducer 96, a rotary electric machine 82, and an energization circuit unit 83. The torque sensor 94 is provided on the steering shaft 91, and detects a steering torque Trq which is an output torque of the steering shaft 91. The rotary electric machine 82 generates an assisting torque corresponding to the detected steering torque Trq and a steering direction of the steering wheel 90. The energization circuit unit 83 performs a drive control of the rotary electric machine 82. The speed reducer 96 transmits the assisting torque to the steering shaft 91 while reducing the rotation of a rotation shaft of a rotor of the rotary electric machine 82.

As shown in FIG. 2, a permanent magnet field type or a winding field type can be used as the rotary electric machine 82. A stator of the rotary electric machine 82 includes a first winding group M1 and a second winding group M2. The first winding group M1 includes a star-connected first U-phase winding U1, a first V-phase winding V1, and a first W-phase winding W1, and the second winding group M2 includes a star-connected phase second U-phase winding U2, a second V-phase winding V2, and a second W-phase winding W2. Respective first ends of the first U-phase winding U1, the first V-phase winding V1, and the first W-phase winding W1 are connected to each other at a neutral point. The first U-phase winding U1, the first V-phase winding V1, and the first W-phase winding W1 are shifted by 120° at an electric angle $\theta e$. Respective first ends of the second U-phase winding U2, the second V-phase winding V2, and second W-phase winding W2 are connected to each other at a neutral point. The second U, V, and W-phase coils U2, V2, and W2 are shifted from one another by 120 degrees in terms of the electrical angle $\theta e$.

The energization circuit unit 83 includes a first inverter INV1 and a second inverter INV2 as power converters, and a first relay RL1 and a second relay RL2 as power supply relays.

In the first inverter INV1, a second end of the first U-phase winding U1 is connected to a connection point between an upper arm switch SU1$p$ and a lower arm switch SU1$n$ of a first U phase. A second end of the first V-phase winding V1 is connected to a connection point between an upper arm switch SV1$p$ and a lower arm switch SV1$n$ of a first V phase. A second end of the first W-phase winding W1 is connected to a connection point between an upper arm switch SW1$p$ and a lower arm switch SW1$n$ of a first W phase. In the second inverter INV2, a second end of the second U-phase winding U1 is connected to a connection point between an upper arm switch SU2$p$ and a lower arm switch SU2$n$ of a second U phase. A second end of the second V-phase winding V2 is connected to a connection point between an upper arm switch SV2$p$ and a lower arm switch SV2$n$ of a second V phase. A second end of the second W-phase winding W2 is connected to a connection point between an upper arm switch SW2$p$ and a lower arm switch SW2$n$ of a second W phase.

The high-potential side terminals of the upper arm switch SU1$p$ of the first U phase, the upper arm switch SV1$p$ of the first V phase, the upper arm switch SW1$p$ of the first W-phase are connected to a positive electrode terminal of a battery 97, which is a DC power supply, through the first relay RL1. The low-potential side terminals of the lower arm switch SU1$n$ of the first U phase, the lower arm switch SV1$n$ of the first V phase, the lower arm switch SW1$n$ of the first W-phase are connected to the ground through resistors RU1, RV1, and RW1, respectively. The high-potential side terminals of the upper arm switch SU2$p$ of the second U phase, the upper arm switch SV2$p$ of the second V phase, and the upper arm switch SW2$p$ of the second W-phase are connected to a positive electrode terminal of the battery 97 through the second relay RL2. The low-potential side terminals of the lower arm switch SU2$n$ of the second U phase, the lower arm switch SV2$n$ of the second V phase, and the lower arm switch SW2$n$ of the second W-phase are connected to the ground through resistors RU2, RV2, and RW2, respectively. The negative electrode terminal of the battery 97 is connected to ground.

As the switches SU1$p$ to SW2$n$, a MOSFET exemplified by the upper semiconductor element 10 and the lower semiconductor element 20 can be used. Each of two switches SU1$p$ and SU1$n$, SV1$p$ and SV1$n$, SW1$p$ and SW1$n$, SU2$p$ and SU2$n$, SV2$p$ and SV2$n$, SW2$p$ and SW2$n$ connected in series in each arm are connected in series by connecting the source electrode of the former MOSFET and the drain electrode of the latter MOSFET.

The semiconductor module 1 can be used as semiconductor modules SU1, SV1, SW1, SU2, SV2, and SW2 in which two switches SU1$p$ and SU1$n$, SV1$p$ and SV1$n$, SW1$p$ and SW1$n$, SU2$p$ and SU2$n$, SV2$p$ and SV2$n$, and SW2$p$ and SW2$n$ connected in series in each arm are integrated together.

When the semiconductor module 1 is used as the semiconductor modules SU1 to SW2, the upper arm switches SU1$p$, SV1$p$, SW1$p$, SU2$p$, SV2$p$, and SW2$p$ correspond to the lower semiconductor element 20, and the lower arm switches SU1$n$, SV1$n$, SW1$n$, SU2$n$, SV2$n$, and SW2$n$ correspond to the upper semiconductor element 10. The electrode pad 122 of the semiconductor module 1 to the side of the power supply relay RL1 and RL2, and the external terminals 102 to 104 are connected to the side of the resistors RU1 to RW2, so that the semiconductor module 1 can be applied to the first inverter INV1 and the second inverter INV2 to configure an inverter circuit.

As the switches SP1 and SC1 configuring the power supply relay RL1 and the switches SP2 and SC2 configuring the power supply relay RL2, a MOSFET exemplified by the upper semiconductor element 10 and the lower semiconductor element 20 can be used. The switches SP1 and SP2 are power supply relay switches, and the switches SC1 and SC2 are reverse connection protective relays. The two switches SP1 and SC1, and SP2 and SC2 connected in series in each arm are connected in series by connecting the source electrodes of the MOSFETs to each other.

When the MOSFETs such as the upper semiconductor element 10 and the lower semiconductor element 20 are used as the switches SU1$p$ to SW2$n$, SP1, SC1, SP2, and SC2, the body diodes of the MOSFETs can be used as freewheeling diodes. For that reason, in FIG. 7, the freewheeling diodes connected in anti-parallel to the respective switches SU1$p$ to SW2$n$, SP1, SC1, SP2, and SC2 are not shown, but the freewheeling diodes may be connected to the respective switches SU1$p$ to SW2$n$, SP1, SC1, SP2, and SC2.

The energization circuit unit 83 detects currents flowing through the resistors RU1, RV1, and RW1 and outputs the detected currents as a first U-phase current Iur1, a first V-phase current Ivr1, and a first W-phase current Iwr1. Further, the energization circuit unit 83 detects the currents flowing through the resistors RU2, RV2, and RW2 and outputs the detected currents as a second U-phase current Iur2, a second V-phase current Ivr2, and a second W-phase current Iwr2.

The energization circuit unit 83 includes an ECU mainly configured by a microcomputer, and the ECU operates the switches of the first inverter INV1 and the second inverter INV2 to control a torque of the rotary electric machine 82 to reach a torque command value Tr*. The torque command value Tr* is set based on, for example, a steering torque Trq detected by the torque sensor 94. The energization circuit unit 83 calculates an electric angle θe of the rotary electric machine 82 by the ECU based on an output signal of an angular sensor. As the angle sensor, for example, an angular sensor including a magnet which is a magnetic generation portion provided on a rotor side of the rotary electric machine 82 and a magnetic detection element provided close to the magnet can be exemplified. The functions provided by the ECU may be provided, for example, by software stored in a tangible memory device and a computer causing the software to be executed, hardware, or a combination of the software, the computer, and the hardware.

As described above, the semiconductor module 1 can be applied to the EPS 80, and can be applied to the energization circuit unit 83 corresponding to a drive circuit of the EPS 80 as the semiconductor modules SU1 to SW2 including two switches connected in series with each other.

Specifically, the semiconductor module 1 can be applied to each of inverter circuits shown as the first inverter INV1 and the second inverter INV2, and the upper semiconductor element 10 and the lower semiconductor element 20 are applied to the inverter circuit as switching elements connected in series with each other.

Figure 7:
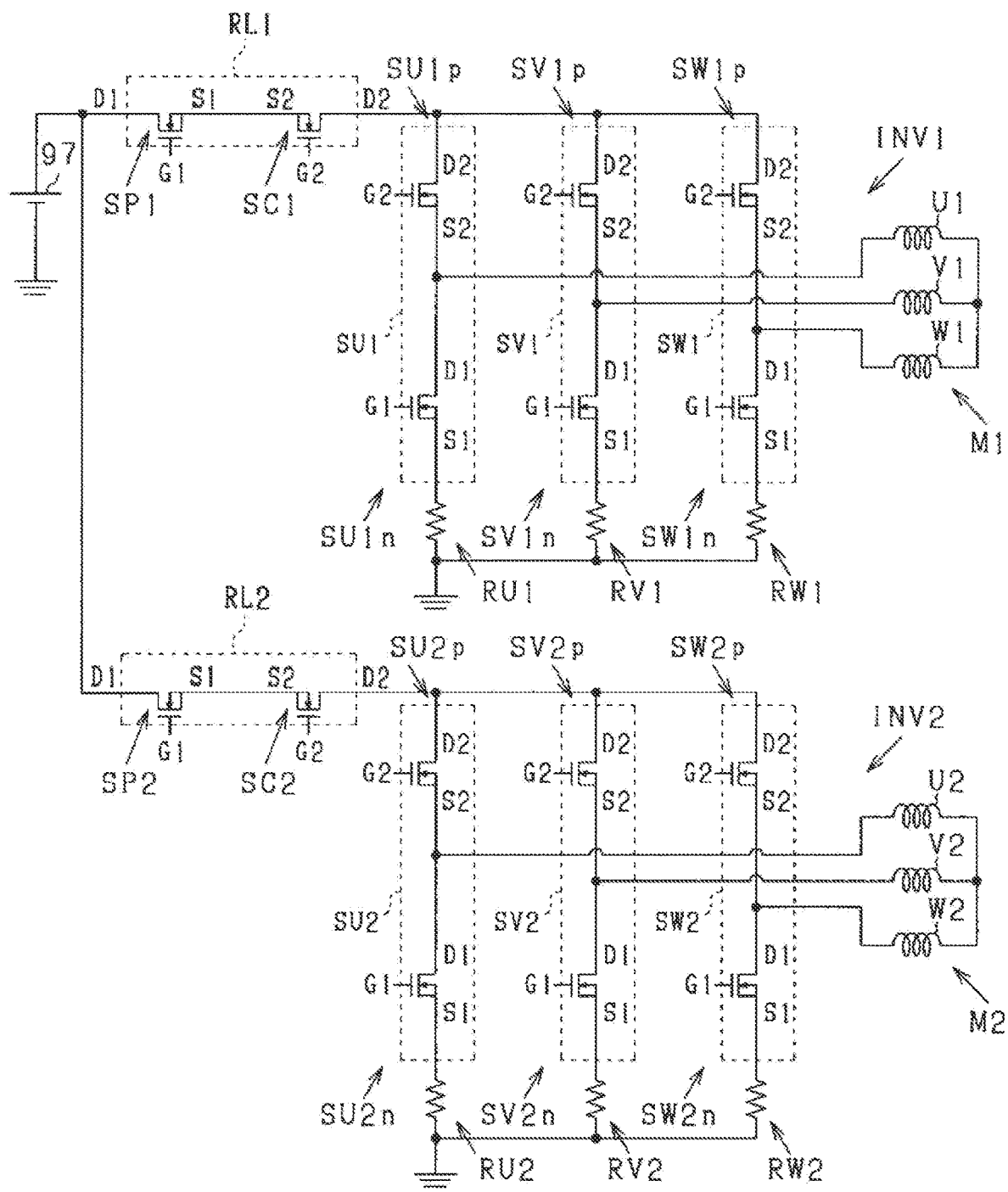
FIG. 7 is a diagram showing a drive circuit of the electric power steering system shown in FIG. 6.

The semiconductor module 1 obtained by inverting the top and bottom of the upper semiconductor element 10 with respect to the semiconductor module 1 can be applied to the power supply relays RL1 and RL2 shown in FIG. 7. In this case, for example, the first conductive member 121 is extended to the bonding plate 116 side instead of the bonding plate 106 and bonded to the bonding plate 106, and the third conductive member 124 is extended to the bonding plate 106 side instead of the bonding plate 116 and bonded to the bonding plate 116. With the substitution described above, the external terminals 102 to 104 function as the first source terminal S1 and the second source terminal S2. The external terminals 112 to 114 serve as the first drain terminal D1.

In the semiconductor module 1, when the semiconductor module 1 is viewed from above under a condition that the resin mold 130 is not arranged, the lower semiconductor element 20 is arranged to be capable of observing the positions of both ends of the substantially orthogonal two sides of the substantially rectangular shape on the upper surface thereof.

As shown in FIG. 3, each configuration included in the resin mold 130 of the semiconductor module 1 is arranged to be capable of observing the four corners 21 to 24 of the substantially rectangular upper surface of the lower semiconductor element 20 when viewed from above. Therefore, for example, the long side connecting the corners 21 and 23 with the corners 21 and the corners 23 as both ends, and the short side connecting the corners 21 and the corners 22 as both ends are selected as two sides that are approximately orthogonal to each other and provide a substantially rectangular shape. Further, for example, the long side connecting the corner 22 and the corner 24 at both ends and the short side connecting the corner 23 and the corner 24 at both ends are selected as two sides that are approximately orthogonal to each other and provide a substantially rectangular shape. As the two sides substantially orthogonal to each other, the long side and the short side in the substantially rectangular shape of the upper surface of the lower semiconductor element 20 may be selected.

The end portions of the substantially orthogonal two sides of the substantially rectangular shape are the corners 21 to 24 on each side of the substantially rectangular shape and the portions in the vicinity thereof. For example, in the long side connecting the corner 21 and the corner 23 with the corner 21 and the corner 23 at both ends, the range from the corner 21 to the predetermined length L1 in the positive direction of the x-axis and the range from the corner 23 to a predetermined length L2 in the negative of the x-axis are defined as the portions of the both ends. The length of the long side connecting the corner 21 and the corner 23 is defined as L0. The predetermined lengths L1 and L2 are less than L0/2, may be more preferably about L0/3 or less, and may be more preferably about L0/4 or less.

By observing the positions of both ends of the two sides substantially orthogonal to each other on the upper surface of the substantially rectangular shape, the positional deviation of the lower semiconductor element 20 can be detected. In the manufacturing process of the semiconductor module 1, the resin mold 130 is formed after manufacturing the structures other than the resin mold 130 as shown in FIGS. 2 to 4. By viewing each configuration of the semiconductor module 1 from above as shown in FIG. 3 at the stage before forming the resin mold 130, the positional deviation of the lower semiconductor element 20 and the like can be detected.

Figure 8:
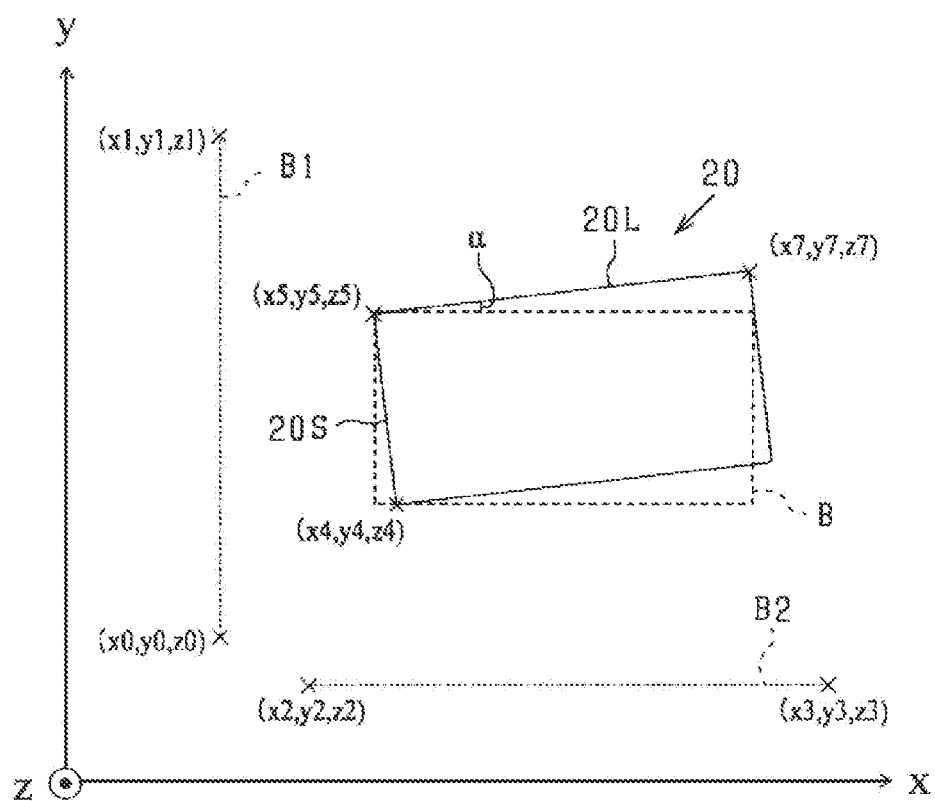
FIG. 8 is a diagram showing a positional deviation detection.
Figure 9:
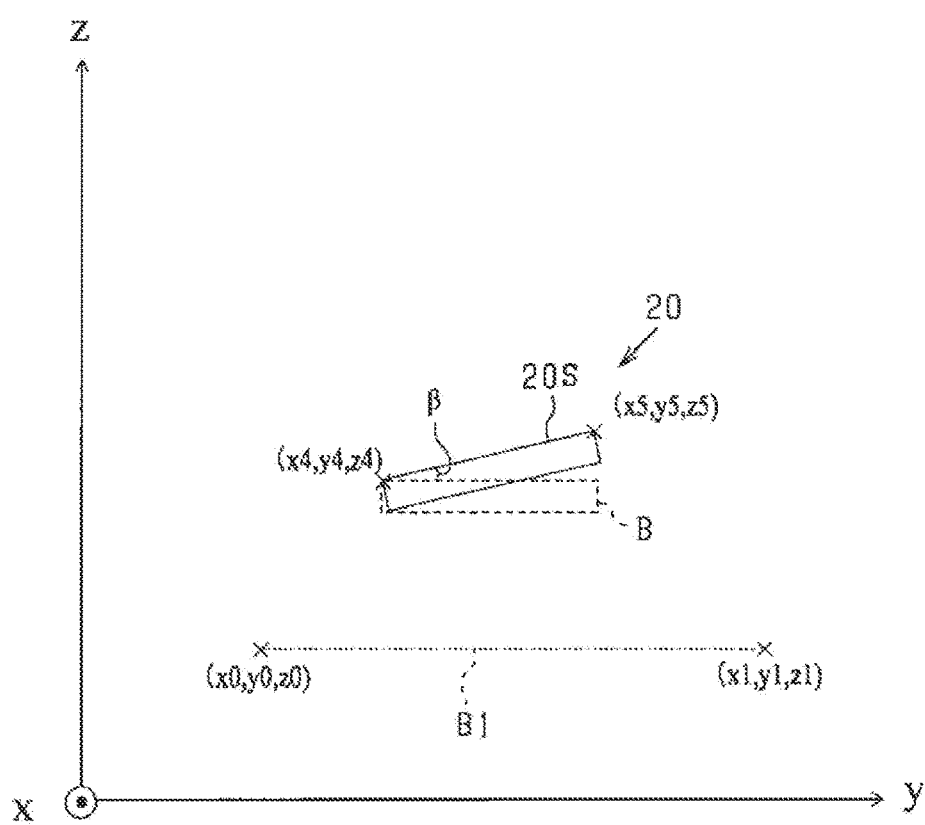
FIG. 9 is a diagram showing a positional deviation detection.
Figure 10:
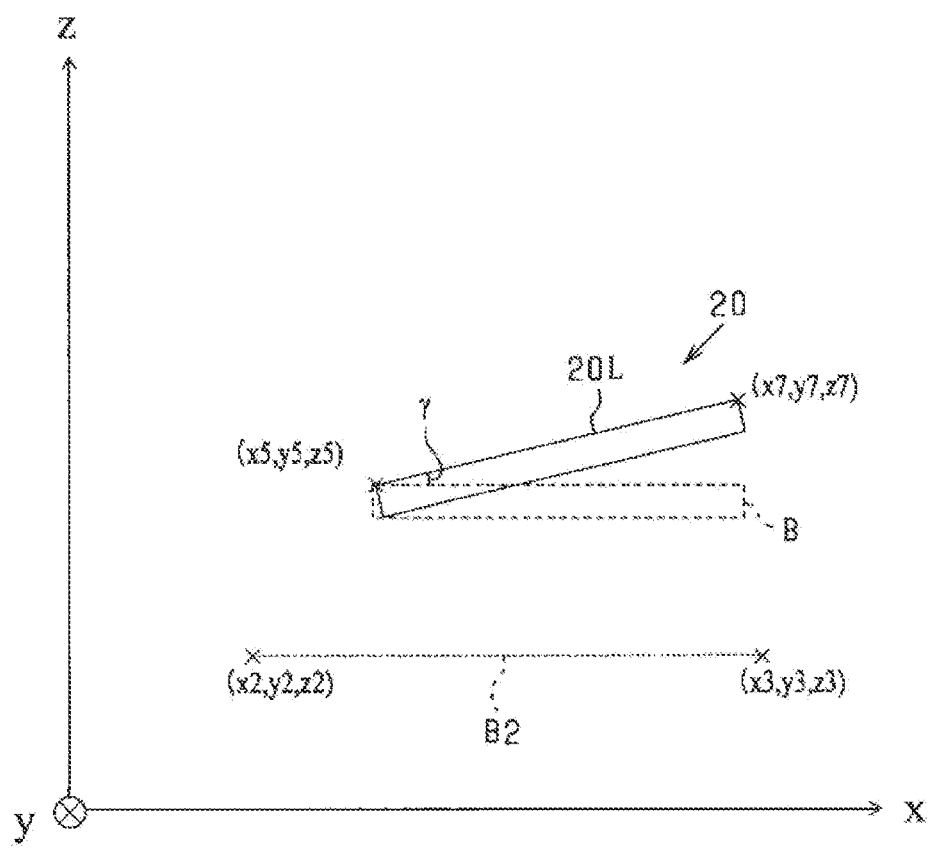
FIG. 10 is a diagram showing a positional deviation detection.
Figure 11:
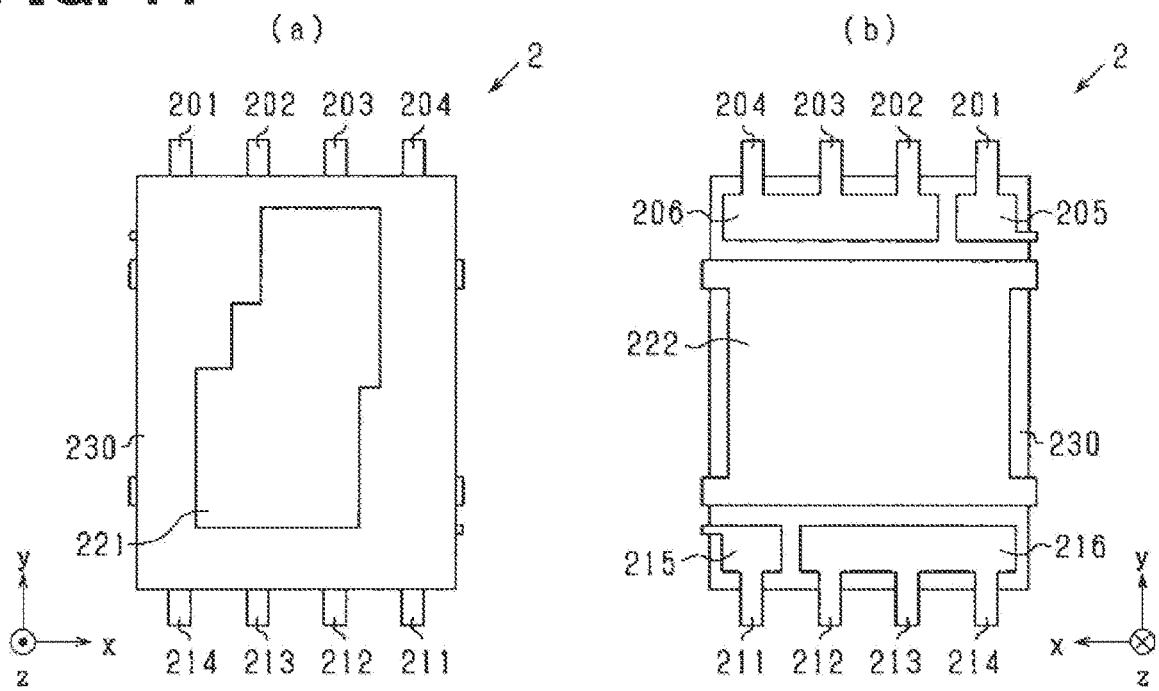
FIG. 11 is a plan view showing a semiconductor module according to a second embodiment.
Figure 12:
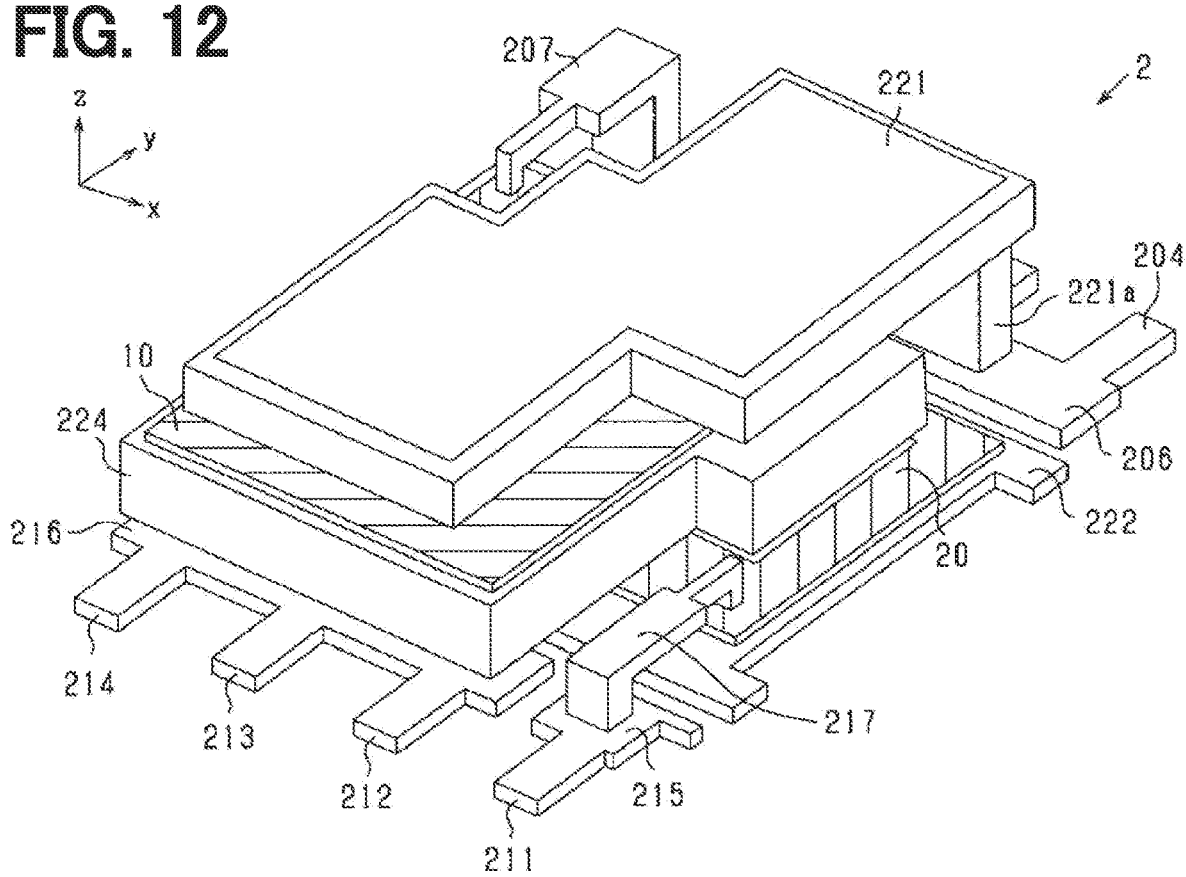
FIG. 12 is a perspective view showing a state in which the resin mold is not arranged in the semiconductor module shown in FIG. 11.

A method for detecting the positional deviation of the lower semiconductor element 20 will be specifically described with an example. As shown in FIGS. 8 to 10, in the xyz coordinate system, the positional deviation of the lower semiconductor element 20 can be detected by calculating the positions of both ends of the lower semiconductor element 20 with respect to the reference lines B1 and B2. The reference lines B1 and B2 are straight lines parallel to the long side and the short side of the reference position B indicating the position of the lower semiconductor element 20 when there is no positional deviation, respectively.

First, as shown in FIG. 8, the positional deviation of the lower semiconductor element 20 in the plane direction (i.e., the positional deviation in the xy plane shown in FIG. 8) is detected by calculating the positions of the three end portions of the lower semiconductor element 20 with respect to the reference lines B1 and B2.

The positions of the end portions on the reference lines B1 and B2 can be expressed by using the coordinates of arbitrary points on the reference line including each end portion. In FIG. 8, the coordinates (x0, y0, z0) and the coordinates (x1, y1, z1) are defined as the positions of both ends of the reference line B1. Further, the coordinates (x2, y2, z2) and the coordinates (x3, y3, z3) are defined as the positions of both ends of the reference line B2. The coordinates (x0, y0, z0) and the coordinates (x1, y1, z1) are the coordinates at both ends of the reference line B1, and the coordinates (x2, y2, z2) and the coordinates (x3, y3, z3) are the coordinates at the both ends of the reference line B2.

The positions of both ends of each side of the lower semiconductor element 20 can be represented by using the coordinates of arbitrary points on the sides of the rectangular shape including each end. In FIG. 8, the coordinates (x5, y5, z5) and the coordinates (x7, y7, z7) are defined as the positions of both ends of the long side 20L. The coordinates (x4, y4, z4) and the coordinates (x5, y5, z5) are defined as the positions of both ends of the short side 20S. The coordinates (x4, y4, z4), coordinates (x5, y5, z5), and coordinates (x7, y7, z7) are the coordinates of both ends of the long side 20L or both ends of the short side 20S, and are the coordinates of the corners 22, 21, 23 of the lower semiconductor element 20.

By using an optical position detection device, the position of the upper surface of the lower semiconductor element 20 can be detected three-dimensionally. The optical position detection sensor may not be limited, for example, a transmission type laser displacement sensor, which is a non-contact laser displacement sensor, may be preferably used. Since the transmission type laser sensor can detect the edge position of the object with high accuracy, the position coordinates on the long side 20L and the short side 20S, which are the edge portions of the upper surface of the lower semiconductor element 20, can be detected with high accuracy.

The positional deviation dx1 of the lower semiconductor element 20 with respect to the reference line B1 in the x direction can be represented by the difference in the x coordinate between the midpoint of the reference line B1 and the midpoint of the short side 20S as shown in the following equation (1). The positional deviation dy1 of the lower semiconductor element 20 with respect to the reference line B2 in the y direction can be expressed by the difference in y-coordinate between the midpoint of the reference line B2 and the midpoint of the long side 20L as shown in the following equation (2).

$$dx1=(x4+x5)/2-(x1+x0)/2 \qquad (1)$$

$$dy1=(y7+y5)/2-(y3+y2)/2 \qquad (2)$$

The reference lines B1 and B2 are parallel to the y-axis and the x-axis, respectively, and when the position of the lower semiconductor element 20 is shifted counterclockwise by the deviation angle $\alpha$ with respect to the reference position B around the coordinates (x5, y5, z5) as a center, the deviation angle $\alpha$ is represented by the following equation (3).

$$\alpha=A\tan\{(y7-y5)/(x7-x5)\} \qquad (3)$$

Next, as shown in FIG. 9, the positional deviation in the yz plane is detected as the vertical positional deviation of the lower semiconductor element 20. The positional deviation dy2 of the lower semiconductor element 20 with respect to the reference line B1 in the y direction can be expressed by the difference in y-coordinate between the midpoint of the reference line B1 and the midpoint of the short side 20S as shown in the following equation (4). The positional deviation dz1 of the lower semiconductor element 20 with respect to the reference line B1 in the z direction can be represented by the difference in the z coordinate between the midpoint of the reference line B1 and the midpoint of the short side 20S as shown in the following equation (5). When the position of the lower semiconductor element 20 is displaced counterclockwise by the deviation angle $\beta$ with respect to the reference position B around the coordinates (x4, y4, z4) as a center, the deviation angle $\beta$ is represented by the following equation (6).

$$dy2=(y5+y4)/2-(y1+y0)/2 \qquad (4)$$

$$dz1=(z5+z4)/2-(z1+z0)/2 \qquad (5)$$

$$\beta=A\tan\{(z5-z4)/(y5-y4)\} \qquad (6)$$

Next, as shown in FIG. 10, the positional deviation in the zx plane is detected as the vertical positional deviation of the lower semiconductor element 20. The positional deviation dx2 of the lower semiconductor element 20 with respect to the reference line B2 in the x direction can be expressed by the difference in x-coordinate between the midpoint of the reference line B2 and the midpoint of the long side 20L as shown in the following equation (7). The positional deviation dz2 of the lower semiconductor element 20 with respect to the reference line B2 in the z direction can be expressed by the difference in z-coordinate between the midpoint of the reference line B2 and the midpoint of the long side 20L as shown in the following equation (8). When the position of the lower semiconductor element 20 is displaced counterclockwise by the deviation angle $\gamma$ with respect to the reference position B around the coordinates (x, y5 z) as a center, the deviation angle $\gamma$ is represented by the following equation (9).

$$dx2=(x7+x5)/2-(x3+x2)/2 \qquad (7)$$

$$dz2=(z7+z5)/2-(z3+z2)/2 \qquad (8)$$

$$\gamma=A\tan\{(z7-z5)/(x7-x5)\} \qquad (9)$$

As described above, in the semiconductor module 1, when the semiconductor module 1 is viewed from above without arranging the resin mold 130, each configuration is arranged such that the positions of both ends of the long side 20L and the positions of both ends of the short side 20S can be observed. Therefore, in the pre-process of forming the resin mold 130, the positions of both ends of the long side 20L and the positions of both ends of the short side 20S can be three-dimensionally detected by optical means or the like. Then, by calculating how much the position of the lower semiconductor element 20 is displaced in the plane direction or the vertical direction with respect to the reference position, the positional deviation of the lower semiconductor element 20 can be detected.

Further, in the semiconductor module 1, as shown in FIG. 3, when viewed from above, each configuration included in the resin mold 130 of the semiconductor module 1 is arranged so that the four corners 11 to 14 of the substantially rectangular upper surface of the upper semiconductor element 10 and the four sides of the substantially rectangular shape in the vicinity of the corners 11 to 14 are observed. That is, the upper semiconductor element 10 is arranged so that when the semiconductor module 1 is viewed from above without arranging the resin mold 130, the positions of both ends of the two substantially orthogonal sides of the substantially rectangular shape on the upper surface can be observed. Therefore, in addition to the lower semiconductor element 20, the positional deviation of the upper semiconductor element 10 can be detected.

Second Embodiment

As shown in FIGS. 11 to 14, in a semiconductor module 2 according to a second embodiment, similarly to the semiconductor module 1, when viewed from the top, an upper semiconductor element 10 is disposed in an orientation of being rotated counterclockwise by approximately 90 degrees about a vertical direction as an axis with respect to a lower semiconductor element 20.

The semiconductor module 2 includes a first conductive member 221, a second conductive member 223, a upper semiconductor element 10, a third conductive member 224, a fourth conductive member 225, a lower semiconductor element 20, and an electrode pad 222 stacked in a stated order from the top. The semiconductor module 2 further includes external terminals 201 to 204 and 211 to 214 and conductive bonding plates 205, 206, 215, and 216 at the same position as that of the electrode pads 222 in the vertical direction. The semiconductor module 2 further includes gate connection members 207 and 217. More specifically, the gate pad of the upper semiconductor element 10 is provided in the vicinity of the corner 13, and the gate pad of the lower semiconductor element 20 is provided in the vicinity of the corner 24.

In the semiconductor module 2, the external terminals 201 to 204 are disposed in a stated order from the negative direction to the positive direction of the x-axis, opposite to the external terminals 101 to 104. Correspondingly, the bonding plate 205 is disposed on the negative side of the x-axis, and the bonding plate 206 is disposed on the positive side of the x-axis.

Corresponding to the placement of the bonding plate 205, when viewed from the top, the second conductive member 223 is shaped to notch a position of a corner in the negative direction of the x-axis and the positive direction of the y-axis, which is closest to the bonding plate 205, among four corners of a rectangle. A gate pad of the upper semiconductor element 10 is provided in the notched portion. When viewed from the top, the fourth conductive member 225 is shaped to notch a position of a corner in the positive direction of the x-axis and the negative direction of the y-axis, which is closest to the bonding plate 215, among four corners of a rectangle. A gate pad of the lower semiconductor element 20 is provided in the notched portion. In other words, in the second embodiment, the upper semiconductor element and the lower semiconductor element 20 are the same in shape and size, but are different from the first embodiment in that the position where the gate pad is provided is different.

The gate connection member 207 is disposed on the negative side of the x-axis opposite to the gate connection member 107. The gate connection member 207 includes a columnar portion extending in the vertical direction on an upper surface of the bonding plate 205, and a beam portion extending from the columnar portion in the negative direction of the y-axis to an upper surface of the upper semiconductor element 10.

The external terminal 201 is a first gate terminal G1 electrically connected to the gate electrode of the upper semiconductor element 10. The external terminal 211 is a second gate terminal G2 electrically connected to the gate electrode 75 of the lower semiconductor element 20. The external terminals 202 to 204 are a first source terminal S1 electrically connected to the source electrode of the upper semiconductor element 10. The external terminals 212 to 214 are a second source terminal S2 electrically connected to the source electrode of the lower semiconductor element 20 and are also a first drain terminal D1 electrically connected to the drain electrode of the upper semiconductor element 10.

Figure 13:
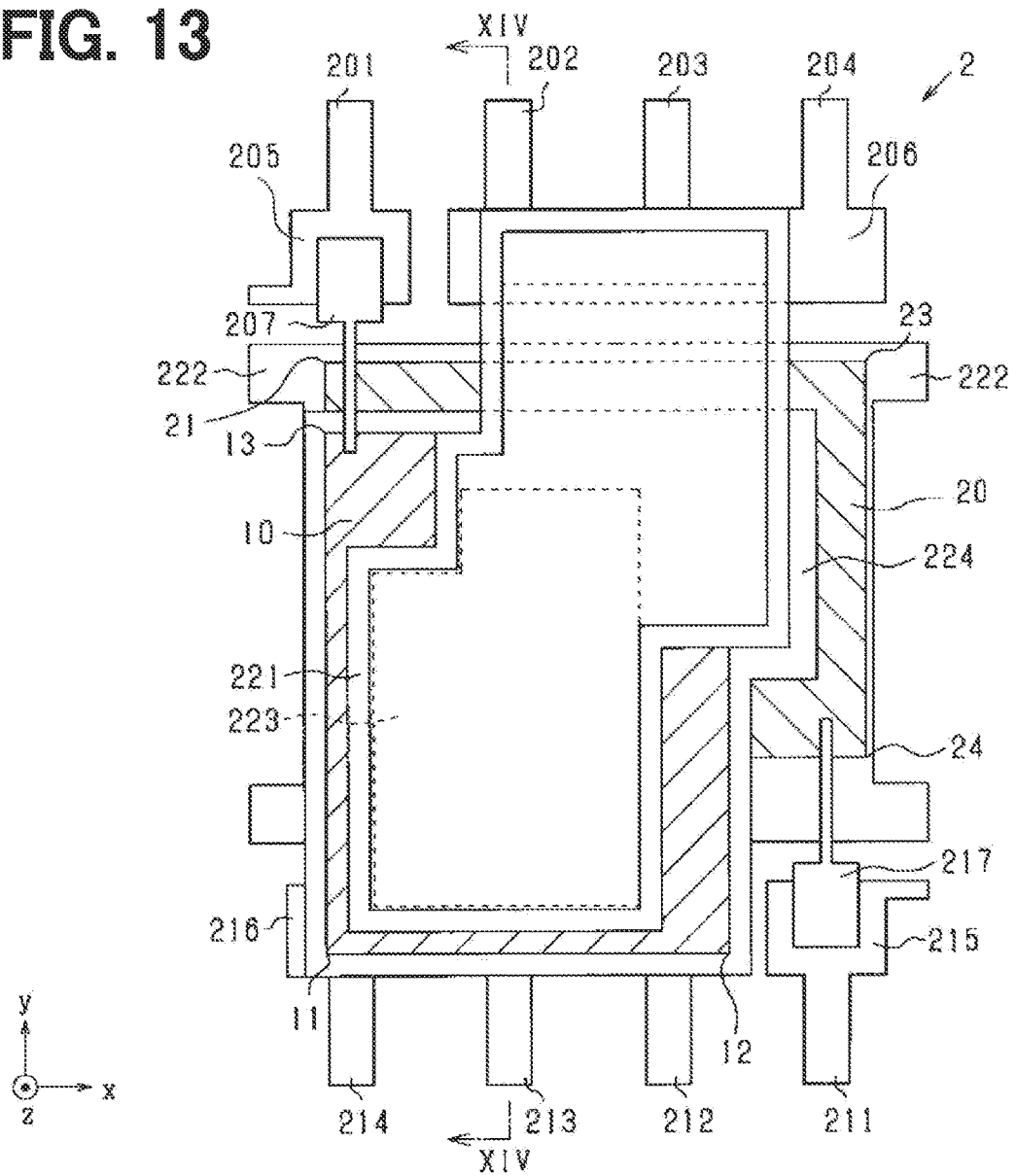
FIG. 13 is a plan view showing a state in which the resin mold is not arranged in the semiconductor module shown in FIG. 11.
Figure 14:
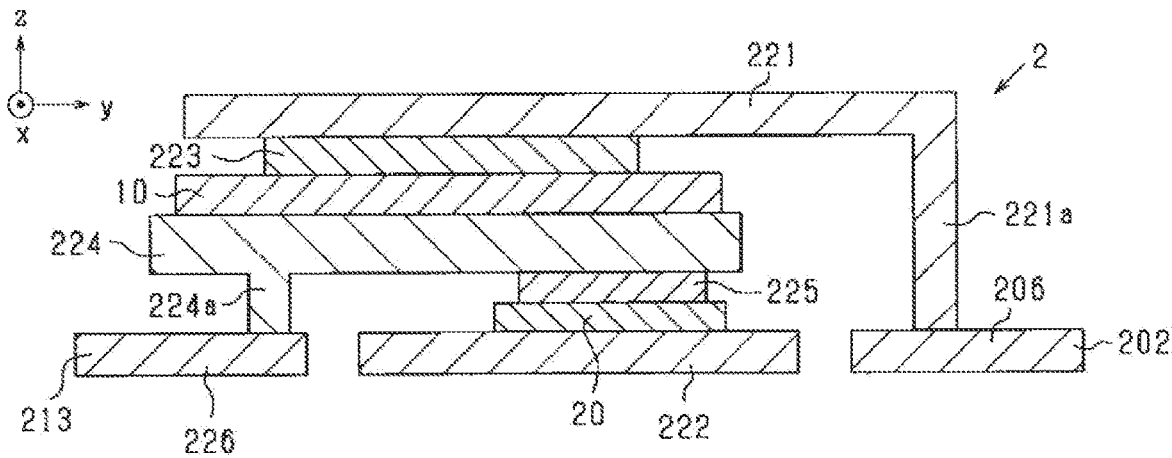
FIG. 14 is a cross-sectional view taken along a line XIV-XIV of FIG. 13.

As shown in FIG. 13, in the semiconductor module 2, when the semiconductor module 2 is viewed from above under a condition that the resin mold 230 is not arranged, the lower semiconductor element 20 is arranged to be capable of observing the positions of both ends of the substantially orthogonal two sides of the substantially rectangular shape on the upper surface thereof. Each configuration included in the resin mold 230 of the semiconductor module 2 is arranged to be capable of observing the three corners 21, 23 and 24 of the substantially rectangular upper surface of the lower semiconductor element 20 when viewed from above. Therefore, for example, the long side connecting the corners 21 and 23 with the corners 21 and the corners 23 as both ends, and the short side connecting the corners 21 and the corners 22 as both ends are selected as two sides that are approximately orthogonal to each other and provide a substantially rectangular shape.

Further, in the semiconductor module 2, as shown in FIG. 13, when viewed from above, each configuration included in the resin mold 230 of the semiconductor module 2 is arranged so that the four corners 11 to 14 of the substantially rectangular upper surface of the upper semiconductor element 10 and the four sides of the substantially rectangular shape in the vicinity of the corners 11 to 14 are observed. That is, the upper semiconductor element 10 is arranged so that when the semiconductor module 2 is viewed from above without arranging the resin mold 230, the positions of both ends of the two substantially orthogonal sides of the substantially rectangular shape on the upper surface can be observed. Therefore, in addition to the lower semiconductor element 20, the positional deviation of the upper semiconductor element 10 can be detected. When the gate pad of the upper semiconductor element 10 and the gate pad of the lower semiconductor element 20 are not provided at positions that are substantially the same positions when viewed individually from the top, as in the semiconductor module 2, it is possible to realize an arrangement in which the positional deviation of the lower semiconductor element 20 or the like can be easily detected.

Other configurations in the semiconductor module 2 are identical with those of the semiconductor module 1, and therefore a description of those configurations will be omitted. The semiconductor module 2 can be applied to the EPS 80, and more specifically, the semiconductor module 2 can be applied to inverter circuits shown as the first inverter INV1 and the second inverter INV2.

Third Embodiment

Figure 15:
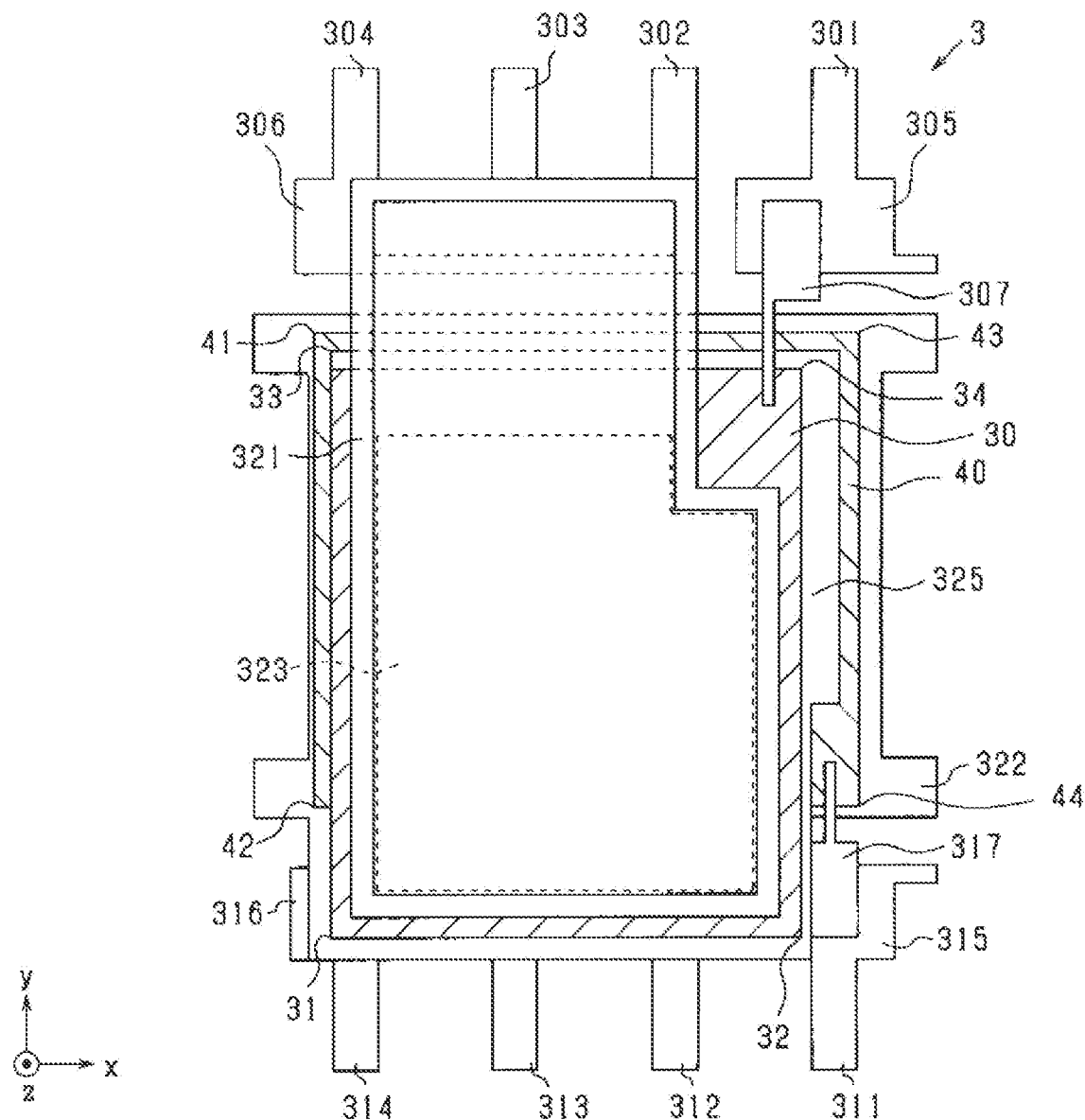
FIG. 15 is a plan view showing a semiconductor module according to a third embodiment.

FIG. 15 is a top view of each configuration inside the resin mold in the semiconductor module 3. As shown in FIG. 15, a semiconductor module 3 according to a third embodiment is different from the semiconductor module 1 in that an upper semiconductor element 30 and a lower semiconductor element 40 are provided instead of the upper semiconductor element 10 and a lower semiconductor element 20. The upper semiconductor element 30 and a lower semiconductor element 40 are semiconductor devices having the same structure, shape, size, and the like. The upper semiconductor element 30 and the lower semiconductor element 40 have a longer length in the short side direction (i.e., the x-axis direction in FIG. 15) in a substantially rectangular shape when viewed from above, as compared with the upper semiconductor element 10 and the lower semiconductor element 20 so that their shape is close to a square.

The upper semiconductor device 30 is disposed such that a longitudinal direction when viewed from the top is in the y-axis direction, and the lower semiconductor device 40 is disposed such that a longitudinal direction when viewed from the top is in the x-axis direction. In other words, when viewed from the top, the upper semiconductor element 30 is disposed in an orientation of being rotated by substantially 90 degrees counterclockwise about the vertical direction as an axis with respect to the lower semiconductor element 40. When the upper semiconductor element 30 and the lower semiconductor element 40 are vertically stacked in the same direction without being displaced from each other in the plane direction, the corner 31 and the corner 41, the corner 32 and the corner 42, the corner 33 and the corner 43, and the corner 34 and the corner 34 are approximately the same position in the plane direction.

The semiconductor module 3 includes a first conductive member 321, a second conductive member 323, a upper semiconductor element 30, a third conductive member 324, a fourth conductive member 325, a lower semiconductor element 40, and an electrode pad 322 stacked in a stated order from the top. The semiconductor module 3 further includes external terminals 301 to 304 and 311 to 314 and conductive bonding plates 305, 306, 315, and 316 at the same position as that of the electrode pads 322 in the vertical direction. The semiconductor module 3 further includes gate connection members 307 and 317.

In the semiconductor module 3, the sizes of the first conductive member 321, the third conductive member 324, and the electrode pad 322 are enlarged in the positive direction of the x-axis in accordance with the sizes of the upper semiconductor element 30 and the lower semiconductor element 40. For example, in the first conductive member 321, the connection portion 321a to be bonded to the bonding plate 306 extends in the positive direction of the x-axis to the same position as that of the external terminal 302. The beam portion of the gate connection member 307 extends from the columnar portion in the negative direction of the y-axis to the upper surface of the upper semiconductor element 30. The gate pad of the upper semiconductor element 30 and the gate pad of the lower semiconductor element 40 are provided at positions such that they are substantially the same position when each is viewed from above. More specifically, the gate pad of the upper semiconductor element 30 is provided in the vicinity of the corner 34, and the gate pad of the lower semiconductor element 40 is provided in the vicinity of the corner 44.

The external terminal 301 is a first gate terminal G1 electrically connected to the gate electrode of the upper semiconductor element 30. The external terminal 311 is a second gate terminal G2 electrically connected to the gate electrode of the lower semiconductor element 40. The external terminals 302 to 304 are a first source terminal S1 electrically connected to the source electrode of the upper semiconductor element 30. The external terminals 312 to 314 are a second source terminal S2 electrically connected to the source electrode of the lower semiconductor element 40 and are also a first drain terminal D1 electrically connected to the drain electrode of the upper semiconductor element 30.

As shown in FIG. 15, in the semiconductor module 3, when the semiconductor module 3 is viewed from above under a condition that the resin mold is not arranged, the lower semiconductor element 40 is arranged to be capable of observing the positions of both ends of the substantially orthogonal two sides of the substantially rectangular shape on the upper surface thereof. Each configuration included in the resin mold of the semiconductor module 3 is arranged to be capable of observing the four corners 41 to 44 of the substantially rectangular upper surface of the lower semiconductor element 40 when viewed from above. Therefore, for example, the long side connecting the corners 41 and 43 with the corners 41 and the corners 43 as both ends, and the short side connecting the corners 41 and the corners 42 as both ends are selected as two sides that are approximately orthogonal to each other and provide a substantially rectangular shape.

Further, in the semiconductor module 3, as shown in FIG. 15, when viewed from above, each configuration included in the resin mold of the semiconductor module 3 is arranged so that the four corners 31 to 34 of the substantially rectangular upper surface of the upper semiconductor element 30 and the four sides of the substantially rectangular shape in the vicinity of the corners 31 to 34 are observed. That is, the upper semiconductor element 30 is arranged so that when the semiconductor module 3 is viewed from above without arranging the resin mold, the positions of both ends of the two substantially orthogonal sides of the substantially rectangular shape on the upper surface can be observed. Therefore, in addition to the lower semiconductor element 40, the positional deviation of the upper semiconductor element 30 can be detected.

Other configurations in the semiconductor module 3 are the same as those of the semiconductor module 1, and therefore a description of those configurations will be omitted. The semiconductor module 3 can be applied to the EPS 80, and more specifically, the semiconductor module 2 can be applied to inverter circuits shown as the first inverter INV1 and the second inverter INV2.

As described above, even when a relatively large upper semiconductor element 30 and lower semiconductor element 40 are provided as in the semiconductor module 3, the upper semiconductor element 30 and the lower semiconductor element 40 are arranged such that the positions of both ends of the two side substantially orthogonal to each other on the upper surface thereof can be observed. For example, such an arrangement can be realized by adjusting the size and shape of the first conductive member 321 and the third conductive member 324, the gate connection members 307 and 317, and the electrode pad 322, which are clips. That is, even when the shapes and sizes of the upper semiconductor elements 10 and 30 and the lower semiconductor elements 20 and 40 are changed in the semiconductor modules 1 to 3, the size and shape of each configuration in the resin mold of the semiconductor module can be adjusted so that it is possible to realize the arrangement of each configuration, similarly to the semiconductor modules 1 to 3, so as to observe the positions of both ends of the two substantially orthogonal sides of the substantially rectangular shape on the upper surface of the lower semiconductor element.

In the semiconductor modules 1 to 3, the case where the upper semiconductor element and the lower semiconductor element have the same size has been described as an example, alternatively, the upper semiconductor element and the lower semiconductor element having different sizes may be used. For example, the third conductive member 124, the fourth conductive member 125, the lower semiconductor element 20, the electrode pad 122 in the semiconductor module 1 may be replaced with the third conductive member 324, the fourth conductive member 325, the lower semiconductor element 40, and the electrode pad 322 in the semiconductor module 3, respectively. When the sizes of the two semiconductor elements to be stacked are different, the area of the upper surface of the lower semiconductor element may be preferably larger than the area of the upper surface of the upper semiconductor element.

When the area of the upper surface of the lower semiconductor element is larger than the area of the upper surface of the upper semiconductor element, it becomes easy to secure a state of the lower semiconductor element in which the positions of both ends of the two sides that are substantially orthogonal to each other on the substantially rectangular shaped upper surface are observed when the semiconductor module is viewed from above without arranging the resin mold. Further, it is possible to secure a state in which the positions of both ends of the two sides substantially orthogonal to each other of the substantially rectangular shape on the upper surface of the lower semiconductor element can be observed, and to secure the overlapping area between the upper semiconductor element and the lower semiconductor element. Therefore, it is possible to easily detect the positional deviation of the lower semiconductor element and to suppress the positional deviation of each configuration in the resin mold of the semiconductor module.

According to the embodiments described above, the following effects can be obtained.

The semiconductor modules 1 to 3 includes: two semiconductor elements 10, 20, 30, 40 having a substantially rectangular shape when viewed from above, and stacked in the up-down direction so as to overlap at least a part thereof; the conductive member stacked on the upper surface side or the lower surface side of the two semiconductor elements and electrically connected to at least one of the two semiconductor elements; and the resin molds 130 and 230 for integrally sealing the two semiconductor elements and the conductive member. By observing the positions of both ends, the position of the lower semiconductor element can be detected, so that the positional deviation between the two stacked semiconductor elements can be easily detected.

The semiconductor elements 10, 20, 30, and 40 are vertical insulated gate type semiconductor devices each including the gate electrode 75, the first electrode (for example, the source electrode 71), and the second electrode (for example, the drain electrode 72). In the semiconductor elements 10, 20, 30, and 40, a voltage is applied to the gate electrode so that a current flows from the first electrode to the second electrode of the semiconductor elements 10, 20, 30, and 40. In this case, the gate pad electrically connected to the gate electrode 75 may be provided at substantially the same position when each of the two semiconductor elements is viewed from above. Either of the two semiconductor elements may be arranged above, and the degree of freedom in design is high.

Further, in the semiconductor modules 1 to 3, it may be preferable that the second electrode (for example, the drain electrode 72) of the lower semiconductor element is electrically connected to the electrode pad (for example, the electrode pad 122) exposed on the lower surface of the resin mold. Further, the conductive members (for example, the first conductive member 121, the second conductive member 123, the third conductive member 124, and the fourth conductive member 125) included in the semiconductor modules 1 to 3 may be thicker than the electrode pads. Since each conductive member is thick and has a weight corresponding to the thickness, it is possible to suppress the positional deviation of each configuration inside the resin mold 130 of the semiconductor module 1.

The two semiconductor elements may be semiconductor devices having the same size. Alternatively, the plurality of semiconductor elements may include semiconductor elements having different sizes, and it may be more preferable that the area of the upper surface of the lower semiconductor element is larger than the area of the upper surface of the upper semiconductor element. In the lower semiconductor element, when the semiconductor module is viewed from above without arranging the resin mold, it becomes easy to secure a state in which the positions of both ends of the two sides substantially orthogonal to each other in the substantially rectangular shape on the upper surface can be observed.

It may be preferable that the upper semiconductor elements 10 and 30 are arranged in a direction rotated by approximately 90 degrees about the vertical direction as an axis with respect to the lower semiconductor element 20. When the upper semiconductor element 10 and the lower semiconductor elements 20 and 40 are arranged in such a positional relationship, it is easy to secure a state in which the positions of both ends of the substantially orthogonal two sides of the substantially rectangular shape on the upper surface of the lower semiconductor element can be observed.

In each of the above embodiments, a trench gate type MOSFET has been exemplified as an element structure of the two semiconductor elements to be stacked, alternatively, the present embodiment may not be limited to this feature, and any two semiconductor elements are stacked and used in the semiconductor module. For example, the semiconductor element structure may be a planar gate type, a p-channel type in which p-type and n-type are substituted in FIG. 5, an insulated gate bipolar transistor (IGBT) or a reverse conduction IGBT (RC-IGBT). When the semiconductor device is an IGBT, the emitter electrode corresponds to a first electrode, and the collector electrode corresponds to a second electrode. An external terminal electrically connected to the emitter electrode corresponds to a first terminal, and an external terminal electrically connected to the collector electrode corresponds to a second terminal.

In FIG. 7, the switches SU1$p$ to SW2$n$ and SP1, SC1, SP2, SC2 are not limited to the MOSFET of the upper semiconductor element 10 and the lower semiconductor element 20, and a voltage-controlled semiconductor switching element such as an IGBT may be used. When an IGBT including no freewheeling diode is used as each of the switches SU1$p$ to SW2$n$, it may be preferable to install a freewheeling diode for each of the switches SU1$p$ to SW2$n$. Specifically, for example, a freewheeling diode may be connected in anti-parallel to each of the switches SU1$p$ to SW2$n$, or a reverse conduction IGBT (RC-IGBT) in which the freewheeling diode is formed in the same semiconductor substrate as the semiconductor substrate of IGBT or the like may be used as each of the switches SU1$p$ to SW2$n$.

Although the semiconductor modules 1 to 3 have been described as examples in which two stacked semiconductor elements are integrally modularized, the present embodiment may not be limited to the above example, and a semiconductor module including three or more semiconductor elements may be used. For example, three configurations inside the resin mold 130 shown in FIGS. 2 to 4 are arranged side by side in the x-axis direction and housed in one resin mold, and six semiconductor elements including three sets of two stacked semiconductor elements may be integrally modularized. When the six semiconductor elements are integrated into a module as described above, for example, a semiconductor module in which SU1, SV1, and SW1 shown in FIG. 7 are integrated together can be configured. Further, in addition to the two stacked semiconductor elements, the semiconductor module may further include an un-stacked semiconductor element.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor module comprising:
   two semiconductor elements having a substantially rectangular shape with adjacent sides being unequal when viewed from above in a vertical direction and stacked in the vertical direction to overlap at least a part of the substantially rectangular shape;

a conductive member stacked on an upper surface side or a lower surface side of the two semiconductor elements and electrically connected to at least one of the two semiconductor elements; and a resin mold integrally sealing the two semiconductor elements and the conductive member, wherein:

a lower semiconductor element of the two semiconductor elements arranged on a lower side is arranged to have at least observable positions of both ends of two sides on the substantially rectangular shape substantially orthogonal to each other when the semiconductor module is viewed from above in the vertical direction without arranging the resin mold; and the two semiconductor elements are stacked to have a direction rotated by approximately 90 degrees with respect to each other in the vertical direction.

2. A semiconductor module comprising:

two semiconductor elements having a substantially rectangular shape with adjacent sides being unequal when viewed from above in a vertical direction and stacked in the vertical direction to overlap at least a part of the substantially rectangular shape;

a conductive member stacked on an upper surface side or a lower surface side of the two semiconductor elements and electrically connected to at least one of the two semiconductor elements; and a resin mold integrally sealing the two semiconductor elements and the conductive member, wherein:

a lower semiconductor element of the two semiconductor elements arranged on a lower side is arranged to have at least observable positions of both ends of two sides on the substantially rectangular shape substantially orthogonal to each other when the semiconductor module is viewed from above in the vertical direction without arranging the resin mold, wherein:

each of the two semiconductor elements is a vertical insulated gate type semiconductor element having: a gate electrode and a first electrode which are disposed on a first surface side of a semiconductor substrate; and a second electrode that is disposed on a second surface side opposing the first surface side of the semiconductor substrate;

a carrier moves from the first electrode to the second electrode of each of the semiconductor elements through a channel provided by application of a voltage to the gate electrode; and a gate pad electrically connected to the gate electrode in each of the two semiconductor elements is disposed at a substantially same position when each of the two semiconductor elements is viewed from above in the vertical direction.

3. A semiconductor module comprising:

two semiconductor elements having a substantially rectangular shape with adjacent sides being unequal when viewed from above in a vertical direction and stacked in the vertical direction to overlap at least a part of the substantially rectangular shape;

a conductive member stacked on an upper surface side or a lower surface side of the two semiconductor elements and electrically connected to at least one of the two semiconductor elements; and a resin mold integrally sealing the two semiconductor elements and the conductive member, wherein:

a lower semiconductor element of the two semiconductor elements arranged on a lower side is arranged to have at least observable positions of both ends of two sides on the substantially rectangular shape substantially orthogonal to each other when the semiconductor module is viewed from above in the vertical direction without arranging the resin mold, wherein:

each of the two semiconductor elements is a vertical insulated gate type semiconductor element having: a gate electrode and a first electrode which are disposed on a first surface side of a semiconductor substrate; and a second electrode that is disposed on a second surface side opposing the first surface side of the semiconductor substrate;

a carrier moves from the first electrode to the second electrode of each of the semiconductor elements through a channel provided by application of a voltage to the gate electrode;

the second electrode of the lower semiconductor element is electrically connected to an electrode pad exposed on a lower surface of the resin mold; and the conductive member is thicker than the electrode pad.

4. The semiconductor module according to claim 1, wherein:

the two semiconductor elements have a same size.

5. The semiconductor module according to claim 1, wherein:

an area of an upper surface of the lower semiconductor element is larger than an area of an upper surface of an upper semiconductor element stacked above the lower semiconductor element.

6. The semiconductor module according to claim 2, wherein:

the two semiconductor elements have a same size.

7. The semiconductor module according to claim 2, wherein:

an area of an upper surface of the lower semiconductor element is larger than an area of an upper surface of an upper semiconductor element stacked above the lower semiconductor element.

8. The semiconductor module according to claim 3, wherein:

the two semiconductor elements have a same size.

9. The semiconductor module according to claim 3, wherein:

an area of an upper surface of the lower semiconductor element is larger than an area of an upper surface of an upper semiconductor element stacked above the lower semiconductor element.

* * * * *